(12) United States Patent
Zhu et al.

(10) Patent No.: US 12,302,462 B2
(45) Date of Patent: May 13, 2025

(54) CONTROL CIRCUIT, CONTROL METHOD AND LIGHTING DEVICE COMPATIBLE WITH DIMMER OR SWITCH (71) Applicant: SAVANT TECHNOLOGIES LLC, East Cleveland, OH (US)

(72) Inventors: Yimin Zhu, Shanghai (CN); Chenyu Hu, Shanghai (CN); Xin Qian, Shanghai (CN); Aijun Wang, Shanghai (CN)

(73) Assignee: SAVANT TECHNOLOGIES LLC, East Cleveland, OH (US)

( * ) Notice: Subject to any disclaimer, the term of this patent is extended or adjusted under 35 U.S.C. 154(b) by 177 days.

(21) Appl. No.: 18/150,640

(22) Filed: Jan. 5, 2023

(65) Prior Publication Data
US 2023/0232512 A1    Jul. 20, 2023

(30) Foreign Application Priority Data

Jan. 10, 2022    (CN) .......................... 202210023193.7
Jan. 10, 2022    (CN) .......................... 202220050372.5

(51) Int. Cl.
| H05B 45/10 | (2020.01) |
| G01R 19/165 | (2006.01) |
| H03K 5/1534 | (2006.01) |
| H05B 45/30 | (2020.01) |
| H05B 47/19 | (2020.01) |

(52) U.S. Cl.
CPC ........... *H05B 45/10* (2020.01); *G01R 19/165* (2013.01); *H03K 5/1534* (2013.01); *H05B 45/30* (2020.01); *H05B 47/19* (2020.01)

(58) Field of Classification Search
CPC ........ H05B 45/10; H05B 45/30; H05B 45/34; H05B 45/345; H05B 45/37; H05B 45/395; H05B 47/19; G01R 19/165; G01R 19/16566; H03K 5/153; H03K 5/1534

See application file for complete search history.

(56) References Cited

U.S. PATENT DOCUMENTS

| 10,285,229 B2 | 5/2019 | Wang et al. |
| 10,512,131 B2 | 12/2019 | Zhu et al. |
| 2022/0232682 A1* | 7/2022 | Luo .................... H05B 45/3725 |

* cited by examiner

*Primary Examiner* — Long Nguyen (57) ABSTRACT

Provided is a control circuit, a control method and a lighting device compatible with a dimmer or switch. The dimmer or switch is connectable to a power supply input end of a light emitting module, and the control circuit includes a charging assistance module for assisting in charging of the dimmer or switch, that includes a first switch and a first resistor having a resistance value lower than a predetermined resistance value, so that when the first switch is turned on, an overall resistance value of the first resistor and the light emitting module is lower than the predetermined resistance value; and a charging control module, includes a constant voltage source and a second switch for controlling a voltage of a first control end of the first switch, so the first switch is turned on when an input voltage of the power supply input end is between 0 and a first predetermined voltage.

20 Claims, 3 Drawing Sheets

CONTROL CIRCUIT, CONTROL METHOD AND LIGHTING DEVICE COMPATIBLE WITH DIMMER OR SWITCH

CROSS-REFERENCE TO RELATED APPLICATIONS

This application claims the benefit of Chinese Patent Application Serial Number 202210023193.7, filed Jan. 10, 2022, and the benefit of Chinese Patent Application Serial Number 202220050372.5, filed Jan. 10, 2022, both of which is herein incorporated by reference.

DESCRIPTION

Field of Technology

The present application relates to a control circuit, a control method, and a lighting device including the same, and more particularly, to a control circuit and a control method compatible with a dimmer or switch, and a lighting device including the control circuit.

Background

Typically, a dimmer or switch used for dimming a lighting device is provided with a digital circuit therein, such as a micro-control unit (MCU). Therefore, a power supply needs to be arranged in the lighting device to supply power to the MCU. The MCU is usually connected in parallel to a capacitor for power supply. When the voltage of the capacitor drops too much due to continuous discharge, the MCU cannot work normally, resulting in flicker or abnormal turn-on/off of the lighting device that is connected to the dimmer or switch. Therefore, it is necessary to periodically charge the capacitor connected to the MCU inside the dimmer or switch.

An additional adapter has been used in the prior art to supply power to the capacitor inside the dimmer or switch, but the cost is high. Therefore, it is desirable to periodically charge the capacitor connected to the MCU in the lighting device by means of a power supply circuit with a simple structure and a low cost.

On the other hand, it is also desirable that the lighting device with the power supply circuit described above may be compatible with the case of no dimmer or switch. That is, it is desirable that the power supply circuit will be enabled only when a power supply input end is connected to the dimmer or switch, and it is desirable that the power supply circuit will be disconnected from the power supply input end when the power supply input end is not connected to the dimmer or switch, so as to avoid high standby power consumption.

SUMMARY

The present application is proposed in view of the above-mentioned problems, and the main objective of the present application is to provide a control circuit, a control method and a lighting device compatible with a dimmer or switch, so as to at least solve technical problems in the prior art that it is difficult to charge a dimmer or switch of a power supply input end in a manner of simple structure and low cost, and that it is difficult to reduce the standby power consumption of the lighting device when the power supply input end is not connected to the dimmer or switch.

In order to achieve the above objective, according to one aspect of the present application, a control circuit compatible with a dimmer or switch is provided, the dimmer or switch may be connected to a power supply input end of a light emitting module, and the control circuit comprises: a charging assistance module, used for assisting in the charging of the dimmer or switch, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value; and a charging control module, including a constant voltage source and a second switch, wherein the charging control module is used for controlling a voltage of a first control end of the first switch, so that the first switch is turned on when an input voltage of the power supply input end is between 0 and a first predetermined voltage.

In this way, within each cycle of the input voltage of the power supply input end, the control circuit allows the existence of a low-resistance state, which is caused by the first resistor and is lower than the predetermined resistance value, in a back-end circuit portion to which the dimmer or switch is connected. Therefore, the dimmer or switch connected to the power supply input end may be charged by a mains supply voltage, so as to ensure that the dimmer or switch that needs to be charged may be in a normal working state.

Further, according to one embodiment of the present application, the first switch is turned on when the voltage of the first control end is higher than a first turn-on voltage, and the second switch is turned on when the voltage of a second control end of the second switch is lower than a second turn-on voltage, wherein when the input voltage of the power supply input end is between 0 and the first predetermined voltage, the voltage of the second control end of the second switch is lower than the second turn-on voltage.

In this way, when the input voltage is between 0 and the first predetermined voltage, the voltage of the second control end is lower than the second turn-on voltage, so that the second switch is turned on, and then the first switch may be turned on. Therefore, the first switch may be turned on when the input voltage is between 0 and the first predetermined voltage.

Further, according to one embodiment of the present application, the constant voltage source is connected to the first control end of the first switch via of the second switch, so that when the second switch is turned on, the voltage of the first control end may be higher than the first turn-on voltage, and the first switch is turned on accordingly.

In this way, when the second switch is turned on, the voltage of the first control end is higher than the first turn-on voltage due to the existence of the constant voltage source, so that the first switch may also be turned on when the second switch is turned on.

Further, according to one embodiment of the present application, the charging assistance module and the light emitting module are connected in parallel to the power supply input end, so that when the first switch is turned on, the overall resistance value of the first resistor and the light emitting module, which are connected in parallel, is lower than the predetermined resistance value.

In this way, the charging assistance module is connected in parallel to the light emitting module, that is, the first resistor is connected in parallel to the light emitting module, therefore, when the first switch is turned on, the overall resistance value of the first resistor and the light emitting module, which are connected in parallel, is lower than the resistance value of the first resistor, and since the resistance value of the first resistor is lower than the predetermined resistance value, the overall resistance value of the first resistor and the light emitting module, which are connected in parallel, is lower than the predetermined resistance value.

Further, according to one embodiment of the present application, the second control end is connected to the power supply input end via a voltage dividing resistor, so that when the input voltage of the power supply input end is lower than the first predetermined voltage, the voltage of the second control end of the second switch is lower than the second turn-on voltage.

In this way, by using the voltage dividing resistor, the voltage of the second control end is proportional to the input voltage of the power supply input end. Therefore, when the input voltage of the power supply input end is lower than the first predetermined voltage, the voltage of the second control end of the second switch is lower than the second turn-on voltage.

Further, according to one embodiment of the present application, the control circuit further comprises a control unit, the control unit is configured to: detect a voltage characteristic of the first control end, the second control end of the second switch, or a third control end located between the first switch and the first resistor; determine, according to the detected voltage characteristic, whether the power supply input end is connected to the dimmer or switch; when it is determined that the power supply input end is not connected to the dimmer or switch, pull down the voltage of the first control end to be lower than the first turn-on voltage of the first switch; and when it is determined that the power supply input end is connected to the dimmer or switch, not adjust the voltage of the first control end.

In this way, by detecting the voltage characteristic of the first control end, the second control end or the third control end, it is possible to determine whether the power supply input end is connected to the dimmer or switch. Therefore, when it is determined that the power supply input end is not connected to the dimmer or switch, the voltage of the first control end may be pulled down to be lower than the first turn-on voltage. As a result, the first switch is kept turned-off, and a connection between the first resistor and the power supply input end is disconnected, thus when the power supply input end is not connected to the dimmer or switch, the standby power consumption of the lighting device may be reduced. At the same time, when the power supply input end is connected to the dimmer or switch, the first switch and the first resistor may be periodically turned on, so as to periodically charge the dimmer or switch.

Further, according to one embodiment of the present application, when detecting the voltage characteristic of the first control end, the voltage characteristic is an interval between adjacent voltage pulses of the first control end; when detecting the voltage characteristic of the second control end, the voltage characteristic is a time length when the voltage of the second control end is lower than a predetermined threshold voltage within one cycle; and when detecting the voltage characteristic of the third control end, the voltage characteristic is the interval between adjacent voltage pulses of the third control end.

In this way, by using the different voltage characteristics presented at the first control end, the second control end or the third control end when the power supply input end is connected to the dimmer or switch or not, and by detecting the interval between the adjacent voltage pulses of the first control end or the third control end, or the time length when the voltage of the second control end is lower than the predetermined threshold voltage within one cycle, it is possible to determine whether the power supply input end is connected to the dimmer or switch.

Further, according to one embodiment of the present application, when it is detected that the interval between the adjacent voltage pulses of the first control end or the third control end is constantly greater than a predetermined time interval, the control unit determines that the power supply input end is connected to the dimmer or switch.

In this way, according to that the interval between the adjacent voltage pulses of the first control end or the third control end is constantly greater than (e.g., greater than within two or more adjacent cycles) the predetermined time interval (e.g., 1 ms), it is possible to determine that the power supply input end is connected to the dimmer or switch.

Further, according to one embodiment of the present application, when it is detected that the time length when the voltage of the second control end is lower than the predetermined threshold voltage within one cycle is longer than a predetermined time period, the control unit determines that the power supply input end is connected to the dimmer or switch.

In this way, since the time length when the voltage of the second control end is lower than the predetermined threshold voltage (for example, a threshold voltage close to 0) within one cycle is longer than a predetermined time period (e.g., 1 ms), it is possible to determine that the power supply input end is connected to the dimmer or switch.

According to another aspect of the present application, a lighting device compatible with a dimmer or switch is provided. The lighting device comprises: a light emitting module, connected to a power supply input end to emit light; and the above control circuit, wherein the control circuit and the light emitting module are connected in parallel to the power supply input end.

In this way, within each cycle of an input voltage of the power supply input end, the lighting device including the control circuit allows the existence of a low-resistance state, which is caused by a first resistor and is lower than a predetermined resistance value, in a back-end circuit portion to which the dimmer or switch is connected. Therefore, the dimmer or switch connected to the power supply input end may be charged by a mains supply voltage, so as to ensure that the dimmer or switch that needs to be charged may be in a normal working state.

Further, according to one embodiment of the present application, the lighting device further comprises a signal control module, wherein the signal control module is configured to: receive a voltage regulation signal from the dimmer or switch, when the dimmer or switch is connected to the power supply input end of the light emitting module; convert the received voltage regulation signal into a driving signal of the light emitting module; and send the converted driving signal to the light emitting module, so that the light emitting module emits light according to the driving signal, instead of emitting light according to the voltage regulation signal.

In this way, while it is possible to indirectly control the light emitting module of the lighting device by means of the dimmer or switch, it is also possible to avoid the failure of the light emitting module resulting from the direct control of the light emitting module by the dimmer or switch.

Further, according to one embodiment of the present application, the signal control module is an application program that is installed in a mobile device far from the light emitting module.

In this way, when a user operates the dimmer or switch, a voltage regulation signal generated on the dimmer or switch may be wirelessly transmitted to an application program in a mobile device (such as an APP in a mobile phone), a light emitting driving signal (e.g. a current driving signal) converted by the application program may be wirelessly transmitted to a driver in the light emitting module, so as to drive the light emitting module to emit light, thereby avoiding the light emitting module directly emitting light according to the voltage regulation signal from the dimmer or switch.

According to another aspect of the present application, a control method compatible with a dimmer or switch is further provided. The dimmer or switch may be connected to a power supply input end of a light emitting module, and the control method comprises: in response to that an input voltage of the power supply input end is between 0 and a first predetermined voltage, turning on a second switch, so that a first switch of a charging assistance module is turned on; and in response to that the input voltage of the power supply input end is not between 0 and the first predetermined voltage, turning off the second switch, so that the first switch of the charging assistance module is turned off, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value, and the voltage of a first control end of the first switch is controlled by a constant voltage source and the second switch, so that when the second switch is turned on, the first switch is turned on, and when the second switch is turned off, the first switch is turned off.

In this way, within each cycle of the input voltage of the power supply input end, there is a low-resistance state, which is caused by the first resistor and is lower than the predetermined resistance value, in a back-end circuit portion to which the dimmer or switch is connected. Therefore, the dimmer or switch connected to the power supply input end may be charged by a mains supply voltage, so as to ensure that the dimmer or switch that needs to be charged may be in a normal working state.

Further, according to one embodiment of the present application, the constant voltage source is connected to the first control end of the first switch via the second switch, so that when the second switch is turned on, the first switch is turned on, and when the second switch is turned off, the first switch is turned off.

In this way, when the second switch is turned on, the voltage of the first control end is higher than a first turn-on voltage due to the existence of the constant voltage source, so that the first switch may also be turned on when the second switch is turned on.

Further, according to one embodiment of the present application, the first switch is turned on when the voltage of the first control end is higher than a first turn-on voltage, the second switch is turned on when the voltage of a second control end of the second switch is lower than a second turn-on voltage, and turning on the second switch in response to that the input voltage of the power supply input end is between 0 and the first predetermined voltage comprises: in response to that the input voltage of the power supply input end is between 0 and the first predetermined voltage, the voltage of the second control end of the second switch is made lower than the second turn-on voltage.

In this way, when the input voltage is between 0 and the first predetermined voltage, the first switch is turned on, therefore the overall resistance value of the first resistor and the light emitting module is lower than the predetermined resistance value.

Further, according to one embodiment of the present application, the second control end is connected to the power supply input end via a voltage dividing resistor, so that when the input voltage of the power supply input end is lower than the first predetermined voltage, the voltage of the second control end of the second switch is lower than the second turn-on voltage.

In this way, by using the voltage dividing resistor, the voltage of the second control end is proportional to the input voltage of the power supply input end. Therefore, when the input voltage of the power supply input end is lower than the first predetermined voltage, the voltage of the second control end of the second switch can be lower than the second turn-on voltage, and then the second switch can be turned on.

Further, according to one embodiment of the present application, the control method further comprises: detecting a voltage characteristic of the first control end, the second control end of the second switch, or a third control end located between the first switch and the first resistor; determining, according to the detected voltage characteristic, whether the power supply input end is connected to the dimmer or switch; when it is determined that the power supply input end is not connected to the dimmer or switch, pulling down the voltage of the first control end to be lower than the first turn-on voltage of the first switch; and when it is determined that the power supply input end is connected to the dimmer or switch, not adjusting the voltage of the first control end.

In this way, by detecting the voltage characteristic of the first control end, the second control end or the third control end, it is possible to determine whether the power supply input end is connected to the dimmer or switch. Therefore, when it is determined that the power supply input end is not connected to the dimmer or switch, the voltage of the first control end may be pulled down to be lower than the first turn-on voltage. As a result, the first switch is kept turned-off, and a connection between the first resistor and the power supply input end is disconnected, thus when the power supply input end is not connected to the dimmer or switch, the standby power consumption of the lighting device may be reduced. At the same time, when the power supply input end is connected to the dimmer or switch, the first switch and the first resistor may be periodically turned on, so as to periodically charge the dimmer or switch.

Further, according to one embodiment of the present application, when detecting the voltage characteristic of the first control end or the third control end, the voltage characteristic is an interval between adjacent voltage pulses of the corresponding control end, and determining, according to the detected voltage characteristic, whether the power supply input end is connected to the dimmer or switch comprises: when it is detected that the interval between the adjacent voltage pulses of the corresponding control end is constantly greater than a predetermined time interval, determining that the power supply input end is connected to the dimmer or switch, and when a case that the interval between the adjacent voltage pulses of the corresponding control end is not greater than the predetermined time interval is detected, determining that the power supply input end is not connected to the dimmer or switch.

In this way, by detecting the time interval between the adjacent voltage pulses of the first control end or the third control end, it is possible to determine whether the power supply input end is connected to the dimmer or switch.

Further, according to one embodiment of the present application, when detecting the voltage characteristic of the second control end, the voltage characteristic is a time length when the voltage of the second control end is lower than a predetermined threshold voltage within one cycle, and determining, according to the detected voltage characteristic, whether the power supply input end is connected to the dimmer or switch comprises: when it is detected that the time length when the voltage of the second control end is lower than the predetermined threshold voltage within one cycle is greater than a predetermined time period, determining that the power supply input end is connected to the dimmer or switch, and when it is detected that the time length when the voltage of the second control end is lower than the predetermined threshold voltage within one cycle is not greater than the predetermined time period, determining that the power supply input end is not connected to the dimmer or switch.

In this way, by detecting the time length when the voltage of the second control end is lower than the predetermined threshold voltage within one cycle, it is also possible to determine whether the power supply input end is connected to the dimmer or switch.

Further, according to one embodiment of the present application, the control method further comprises: receiving a voltage regulation signal from the dimmer or switch, when the dimmer or switch is connected to the power supply input end of the light emitting module; converting the received voltage regulation signal into a driving signal of the light emitting module; and sending the converted driving signal to the light emitting module, so that the light emitting module emits light according to the driving signal, instead of emitting light according to the voltage regulation signal.

In this way, while it is possible to indirectly control the light emitting module by means of the dimmer or switch, it is also possible to avoid the failure of the light emitting module resulting from the direct control of the light emitting module by the dimmer or switch.

In the embodiments of the present application, a control circuit, a control method and a lighting device compatible with a dimmer or switch are provided. The dimmer or switch may be connected to a power supply input end of a light emitting module, and the control circuit comprises: a charging assistance module, used for assisting in the charging of the dimmer or switch, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value; and a charging control module, including a constant voltage source and a second switch, wherein the charging control module is used for controlling a voltage of a first control end of the first switch, so that the first switch is turned on when an input voltage of the power supply input end is between 0 and a first predetermined voltage. In this way, the following technical problems in the prior art are at least solved: it is difficult to charge the dimmer or switch of the power supply input end in a manner of simple structure and low cost, and it is difficult to reduce the standby power consumption of the lighting device when the power supply input end is not connected to the dimmer or switch. Accordingly, the following effects are realized: the dimmer or switch of the power supply input end may be charged by using a power supply circuit that has a simple structure and a low cost, and at the same time, the standby power consumption of the lighting device may be reduced when the power supply input end is not connected to the dimmer or switch.

BRIEF DESCRIPTION OF THE DRAWINGS

The drawings constituting a part of the present application are used for providing a further understanding of the present application, and the exemplary embodiments of the present application and descriptions thereof are used for explaining the present application, but do not constitute improper limitations of the present application. In the drawings.

DETAILED DESCRIPTION

To make it necessary to explain, if there is no conflict, embodiments in the present application and features in the embodiments may be combined with each other. Hereinafter, the present application will be described in detail with reference to the drawings and in combination with the embodiments.

It should be pointed out that, unless otherwise specified, all technical and scientific terms used in the present application have the same meanings as commonly understood by those of ordinary skill in the technical field to which the present application belongs.

In present application, unless otherwise stated, orientation words used such as "up, down, top and bottom" are usually directed to the directions shown in the drawings, or are directed to the vertical, perpendicular or gravitational direction of components themselves; and similarly, for the convenience of understanding and description, "inside and outside" refer to inside and outside relative to the contours of the components themselves, but the above-mentioned orientation words are not used for limiting the present application.

One objective of the present application is to provide an adaptive control circuit and a control method compatible with a dimmer or switch, and a lighting device including the same. The adaptive control circuit is an adaptive circuit composed of pure hardware, and may automatically charge the dimmer or switch (e.g., a capacitor in the dimmer or switch) within each cycle of an input voltage of a power supply input end. It should be noted that, the dimmer or switch here is a dimmer or switch that needs to be charged, such as a smart dimmer/smart switch, more specifically, such as a no-neutral smart dimmer.

Another objective of the present application is to provide a regulation function in the above adaptive control circuit and the control method compatible with the dimmer or switch, and the lighting device including the same. Therefore, when it is detected that the power supply input end is not connected to the dimmer or switch, a connection between a resistor in the adaptive control circuit and the power supply input end may be disconnected, so as to avoid high power consumption caused by the resistor in the adaptive control circuit in the case where there is no dimmer or switch. It should be noted that, the dimmer or switch here is not limited to the dimmer or switch that needs to be charged, and may also be a dimmer or switch that does not need to be charged.

First, the adaptive control circuit and the control method compatible with the dimmer or switch, and the lighting device including the same according to the embodiment of the present application will be described. The dimmer or switch may be connected to the power supply input end, and an LED light emitting module is connected to the power supply input end, so as to emit light under the control of the dimmer or switch.

The principle of the adaptive control circuit is when the power supply input end is connected to the dimmer or switch, an input voltage VAC from the power supply input end after passing through the dimmer or switch is a phase-cut mains AC half wave. Within each cycle of the phase-cut mains AC half wave, there are a time period when the voltage is 0 and a time period when the voltage is not 0. The time period when the voltage is not 0 corresponds to a turn-on time period of the dimmer or switch, at this time, since the power supply input end is connected to the light emitting module of the lighting device, the capacitor in the dimmer or switch cannot be charged. The time period when the voltage is 0 corresponds to a turn-off time period of the dimmer or switch, and at this time, the capacitor or other components in the dimmer or switch may be charged. It should be noted that, the difference between a dimmer and a switch in the present application lies in: in the dimmer (such as a smart dimmer), a phase-cut angle of a voltage waveform may be adjusted, that is, a user may change, by adjusting the dimmer, the length of the time period when the voltage is 0 in the voltage waveform passing through the dimmer; while in the switch (such as a smart switch), the user may only control the on-off of the switch, and the voltage waveform after the switch is turned on cannot be adjusted, that is, the length of the time period when the voltage is 0 in the voltage waveform passing through the switch cannot be adjusted.

To charge the capacitor in the dimmer or switch within the turn-off time period of the dimmer or switch, it is necessary to form a charging loop by means of the power supply input end, the capacitor of the dimmer or switch and an LED light emitting module at a back end. However, since the existing LED light emitting module is in a high-resistance state, the charging loop cannot be formed to charge the capacitor. Therefore, to charge the capacitor in the dimmer or switch within the turn-off time period of the dimmer or switch, it is necessary to convert the LED light emitting module in the loop into a low-resistance state within the turn-off time period of the dimmer or switch.

Therefore, the purpose of the adaptive control circuit compatible with the dimmer or switch according to the embodiment of the present application is when the power supply input end is connected to the dimmer or switch, during the time period when the voltage is 0 in each cycle of the input voltage, the connected LED light emitting module is adaptively converted into the low-resistance state by means of the adaptive control circuit.

Figure 1:
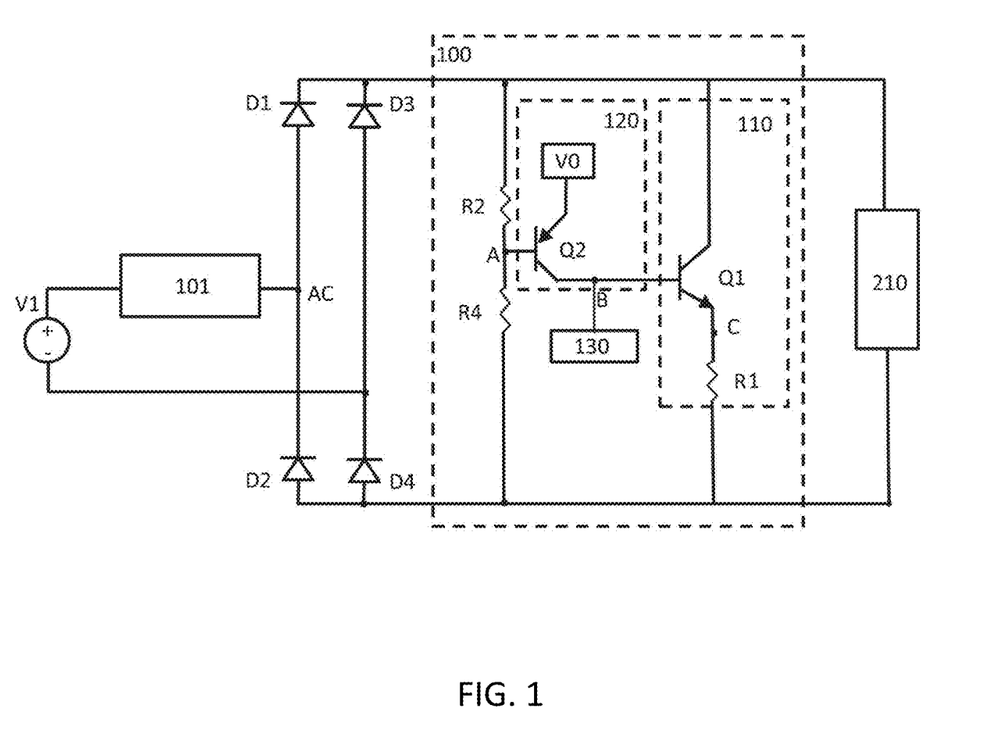
FIG. 1 shows a schematic structural diagram of a control circuit compatible with a dimmer or switch according to an embodiment of the present application.

To achieve this purpose, a control circuit compatible with a dimmer or switch according to an embodiment of the present application is provided, wherein a dimmer or switch 101 may be connected to a power supply input end of a light emitting module 210. The control circuit 100 comprises: a charging assistance module 110, which is used for assisting in the charging of the dimmer or switch 101, and comprises a first switch Q1 and a first resistor R1, wherein a resistance value of the first resistor R1 is lower than a predetermined resistance value, so that when the first switch Q1 is turned on, an overall resistance value of the first resistor R1 and the light emitting module 210 is lower than the predetermined resistance value; and a charging control module 120, including a constant voltage source V0 and a second switch Q2, wherein the charging control module is used for controlling a voltage of a first control end B of the first switch Q1, so that the first switch Q1 is turned on when an input voltage of the power supply input end AC is between 0 and a first predetermined voltage.

By using the above control circuit 100, when the power supply input end AC is connected to the dimmer or switch 101, the first switch Q1 is turned on when the input voltage $V_{AC}$ of the power supply input end is between 0 and the first predetermined voltage, at this time, the first resistor R1 lower than the predetermined resistance value causes the overall resistance value of the first resistor R1 and the light emitting module 210 to be lower than the predetermined resistance value. Therefore, even if the light emitting module 210 has a higher resistance value, the overall resistance value of a back-end portion (i.e., the control circuit 100 and the light emitting module 210) to which the dimmer or switch 101 is connected is in a low-resistance state that is lower than the predetermined resistance value. At this time, a mains supply voltage V1 may charge the dimmer or switch 101. That is, by using such a control circuit, within each cycle of the input voltage $V_{AC}$ of the power supply input end AC, there is a low-resistance state, which is caused by the first resistor R1 and is lower than the predetermined resistance value, in the back-end portion to which the dimmer or switch 101 is connected. Therefore, the dimmer or switch 101 may be charged by the mains supply voltage V1, so as to ensure that the dimmer or switch 101 may be in a normal working state.

It should be noted that in the present application, the first predetermined voltage is less than the maximum value of the input voltage VAC. For example, when the maximum value of the input voltage VAC is about 150V, the first predetermined voltage is about 30V. At this time, the first switch Q1 is turned on when the input voltage VAC is about 0 to 30V.

Further, the first switch Q1 is turned on when the voltage of the first control end B is higher than a first turn-on voltage, and the second switch Q2 is turned on when the voltage of a second control end A of the second switch Q2 is lower than a second turn-on voltage, wherein when the input voltage $V_{AC}$ of the power supply input end AC is between 0 and the first predetermined voltage, the voltage of the second control end A of the second switch Q2 is lower than the second turn-on voltage.

In this way, the second switch Q2 is turned on when the voltage of the second control end A is lower than the second turn-on voltage, and the voltage of the second control end A is lower than the second turn-on voltage when the input voltage VAC is between 0 and the first predetermined voltage, so that when the input voltage VAC is between 0 and the first predetermined voltage, the second switch may be turned on, and then the first switch Q1 may be turned on.

It should be noted that in the present application, to turn on the first switch Q1 when the voltage of the first control end B is higher than the first turn-on voltage, and to turn on the second switch Q2 when the voltage of the second control end A of the second switch Q2 is lower than the second turn-on voltage, the first switch Q1 may be an NPN type transistor, and the second switch Q2 may be a PNP type transistor. At this time, the first turn-on voltage is an emitter voltage (for example, the voltage $V_C$ of a third control end C in the present application) of the first switch Q1+0.7V, and the second turn-on voltage is the emitter voltage (i.e., an output voltage V0 of the constant voltage source V0) of the second switch Q2−0.7V. That is, when $V_B > V_C + 0.7V$, the first switch Q1 is turned on; and when $V_A < V0 − 0.7V$, the second switch Q2 is turned on. In addition, when the first switch Q1 is not turned on, the first resistor R1 is grounded, that is, the third control end C is grounded, so that $V_C = 0$, and thus it may be considered that the first turn-on voltage is 0.7V. Moreover, according to the characteristics of the transistor, when the first switch Q1 is turned on and $V_C$ is not 0, $V_B = V_C + 0.7V$.

It should be noted that in the present application, 0.7V is only an example of a turn-on threshold voltage of the transistor, and depending on the type of the transistor used, there may be other turn-on threshold voltages.

It should also be noted that the first switch Q1 and the second switch Q2 being a pair of transistors is only an exemplary example of the present application. The first switch Q1 and the second switch Q2 may also be other switching devices, such as a pair of MOS transistors.

Further, the constant voltage source V0 is connected to the first control end B of the first switch Q1 via the second switch Q2, so that when the second switch Q2 is turned on, the voltage of the first control end B may be higher than the first turn-on voltage, and then the first switch Q1 is turned on.

Since the constant voltage source V0 is connected to the first control end B of the first switch Q1 via the second switch Q2, when the second switch Q2 is turned on, the voltage of the first control end B rises to be higher than the first turn-on voltage due to the constant voltage source V0, the voltage of the first control end B higher than the first turn-on voltage causes the first switch Q1 to be turned on. That is, by using the constant voltage source V0, when the second switch Q2 is turned on, the first switch Q1 may be turned on. It should be noted that, when the first switch Q1 and the second switch Q2 are a pair of transistors, the constant voltage source V0 may output a constant voltage, for example, 3.3V.

Further, the charging assistance module 110 and the light emitting module 210 are connected in parallel to the power supply input end, so that when the first switch Q1 is turned on, the overall resistance value of the first resistor R1 and the light emitting module 210, which are connected in parallel, is lower than the predetermined resistance value.

Since the charging assistance module 110 is connected in parallel to the light emitting module 210, that is, the first resistor R1 is connected in parallel to the light emitting module 210. Therefore, when the first switch Q1 is turned on, the parallel resistance of the first resistor R1 and the light emitting module 210 will be lower than the resistance value of the first resistor R1; and since the resistance value of the first resistor R1 is in the low-resistance state that is lower than the predetermined resistance value, the overall resistance value of the first resistor R1 and the light emitting module 210, which are connected in parallel, are in the low-resistance state, and in turn the overall resistance value of the control circuit 100 and the light emitting module 210 are also in the low-resistance state.

In the present application, the resistance value of the first resistor R1 may be, for example, 20Ω, and the predetermined resistance value may be, for example, 25Ω, 30Ω, 50Ω, etc. When the resistance value of the back end connected to the dimmer or switch 101 is lower than the predetermined resistance value, the dimmer or switch 101 may be charged by the mains supply voltage V1.

Further, the second control end A is connected to the power supply input end AC via a voltage dividing resistor, so that when the input voltage VAC of the power supply input end is lower than the first predetermined voltage, the voltage of the second control end A of the second switch Q2 is lower than the second turn-on voltage.

Since the second control end A is connected to the power supply input end AC via a voltage dividing resistor, the voltage $V_A$ of the second control end A is proportional to the input voltage $V_{AC}$ of the power supply input end AC. As shown in FIG. 1, the voltage dividing resistor may include a second resistor R2 and a fourth resistor R4, which are connected in series, and the second control end A is connected to a node between the second resistor R2 and the fourth resistor R4.

Therefore, when the input voltage VAC of the power supply input end is lower than the first predetermined voltage, the voltage of the second control end A of the second switch Q2 may be lower than the second turn-on voltage. At this time, the first predetermined voltage is equal to the second turn-on voltage divided by a voltage dividing ratio. For example, when R2=500 kΩ, and R4=50 kΩ, the voltage dividing ratio is 1/11. At this time, the first predetermined voltage is equal to 11×the second turn-on voltage.

As shown in FIG. 1, in the present application, the control circuit 100 may further include a rectifier circuit composed of diodes D1 to D4.

Next, when the power supply input end is not connected to the dimmer or switch and when the power supply input end is connected to the dimmer or switch, waveforms of the input voltage VAC of the power supply input end, and the voltages of the first control end B, the second control end A, and the third control end C between the first switch Q1 and the first resistor R1 will be described with reference to FIGS. 2A and 2B.

Figure 2A:
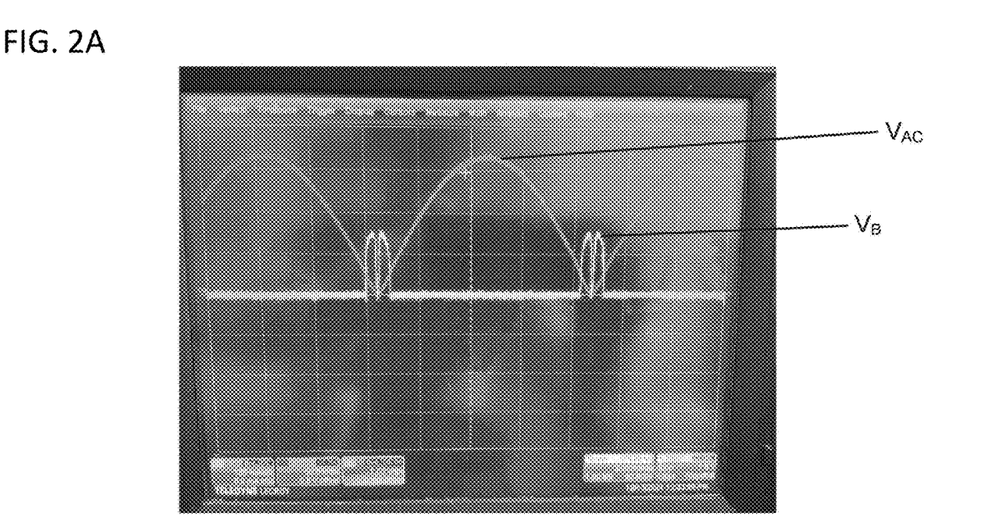
FIGS. 2A and 2B respectively show waveform diagrams of an input voltage VAC of a power supply input end AC and a voltage VB of a first control end B of a first switch Q1, which are measured when the power supply input end is not connected to a dimmer and when the power supply input end is connected to the dimmer.

As shown in FIG. 2A, at this time, the power supply input end AC is not connected to the dimmer or switch, therefore the input voltage VAC is the mains power supply voltage V1, which is a mains AC half wave (i.e., a sine wave or a steamed bun wave). Since the voltage of the second control end A is proportional to the input voltage $V_{AC}$, the voltage waveform of the second control end A is similar to the voltage waveform of the input voltage $V_{AC}$. When the input voltage $V_{AC}$ is less than the first predetermined voltage, the voltage $V_A$ of the second control end A is lower than the second turn-on voltage, so that the second switch Q2 is turned on, resulting in a rise in the voltage of the first control end B (shown by two adjacent voltage pulses of $V_B$ in FIG. 2A). As a result, the first switch Q1 is also turned on. Therefore, the voltage of the third control end C rises when the first switch Q1 is turned on and $V_{AC}$ is not 0 (similar to the two adjacent voltage pulses of $V_B$ shown in FIG. 2A). It should be noted that, when the first switch Q1 is a transistor, the voltage of the first control end B is greater than the voltage of the third control end C by a predetermined size (for example, 0.7V) when the first switch Q1 is turned on, so the voltage waveform of the third control end C is similar to the voltage waveform of the first control end B in FIG. 2A.

Figure 2B:
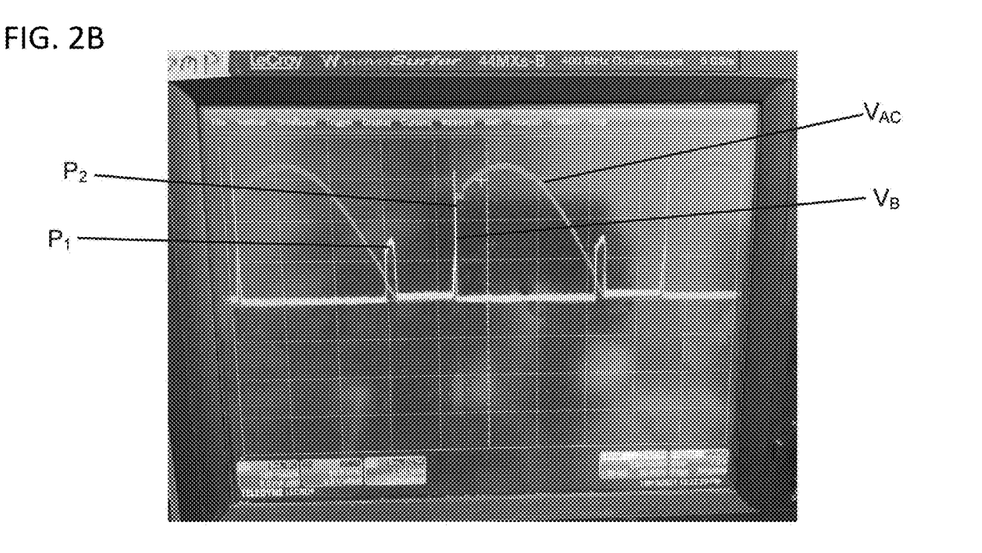

As shown in FIG. 2B, at this time, the power supply input end AC is connected to the dimmer or switch, therefore the input voltage $V_{AC}$ is a phase-cut mains AC half wave. That is, when the mains AC half wave is regarded as an AC half wave with a phase angle of 180 degrees, depending on the phase angle adjusted by the dimmer or a cut-off angle of the switch, a part of the voltage is cut off to 0. Therefore, after passing through the dimmer or switch 101, the input voltage $V_{AC}$ appears as the phase-cut mains AC half wave. At this time, the voltage of the second control end A is proportional to the input voltage $V_{AC}$, and the voltage waveform of the second control end A is similar to the voltage waveform of the input voltage $V_{AC}$. Similarly, when the input voltage $V_{AC}$ is less than the first predetermined voltage, the voltage $V_A$ of the second control end A is lower than the second turn-on voltage, so that the second switch Q2 is turned on, resulting in a rise in the voltage of the first control end B (shown by the voltage waveforms from a pulse $P_1$ to a pulse $P_2$ of $V_B$ in (b)), and thus the first switch Q1 is turned on. Therefore, in FIG. 2B, within one cycle of $V_B$, a time period from the pulse $P_1$ to the pulse $P_2$ corresponds to a turn-on time period of the second switch Q2 and the first switch Q1. It should be noted that, when the first switch Q1 is a transistor, the voltage waveform of the third control end C is similar to the voltage waveform of the first control end B in FIG. 2B, and the difference only lies in that, within the time periods in the pulse $P_1$ and the pulse $P_2$, the voltage of the first control end B is 0.7V higher than the voltage of the third control end C, and within the time period between the pulse $P_1$ and the pulse $P_2$, $V_C=0$ (because $V_{AC}=0$).

Therefore, an intersection of the time period when VAC is 0 (a turn-off time period of the dimmer or switch) and the time period from the pulse $P_1$ to the pulse $P_2$ (that is, the turn-on time period of the first switch Q1) is a time period during which the mains supply voltage V1 may charge the dimmer or switch. In an exemplary example of the present application, in fact, the time period corresponding to the pulse $P_2$ is the time period during which the mains supply voltage V1 may charge the dimmer or switch within each cycle. At this time, the dimmer or switch 101 is turned off and the first switch Q1 is turned on, so that the overall resistance value of the control circuit 100 connected to the dimmer or switch and the light emitting module 210 is in the low-resistance state, and the mains supply voltage V1 is higher than the voltage of the capacitor inside the dimmer or switch 101.

It has been described with reference to FIGS. 2A and 2B, that when the power supply input end is not connected to the dimmer or switch and the power supply input end is connected to the dimmer or switch, the input voltage $V_{AC}$, and the voltages of the first control end B, the second control end A, and the third control end C present different waveforms. Therefore, the applicant considers further providing a regulation function in the control circuit 100, so as to be able to identify whether the power supply input end AC is connected to the dimmer or switch according to measured characteristics of the voltage waveforms, and to disconnect the first resistor R1 from the power supply input end AC when it is identified that the power supply input end is not connected to the dimmer or switch, so as to avoid high power consumption caused by the periodic current on the first resistor R1 at this time.

Referring back to FIG. 1, as shown in FIG. 1, the control circuit 100 further comprises a control unit 130 at this time.

The control unit 130 is configured to: detect a voltage characteristic of the first control end B of the first switch Q1, the second control end A of the second switch Q2, or a third control end C located between the first switch Q1 and the first resistor R1; determine, according to the detected voltage characteristic, whether the power supply input end is connected to the dimmer or switch, wherein the dimmer or switch may be a dimmer or switch that requires no power supply; and when it is determined that the power supply input end is not connected to the dimmer or switch, pull down the voltage of the first control end B to be lower than the first turn-on voltage of the first switch Q1.

In this way, by detecting the voltage characteristic of A, B or C, the control unit 130 may determine whether the power supply input end is connected to the dimmer or switch, and may pull down the voltage of the first control end B to be lower than the first turn-on voltage of the first switch Q1 when it is determined that the power supply input end is not connected to the dimmer or switch. As a result, the first switch Q1 is kept turn-off, and a connection between the first resistor R1 and the power supply input end is disconnected, so as to avoid the high power consumption caused by the periodic current on the first resistor R1.

In the present application, the control unit 130 is, for example, an existing micro-control unit inside the lighting device 200. The existing micro-control unit may be used for processing a digital signal received from the outside of the lighting device and converting the digital signal into an analog signal, so as to control light properties of the light emitted by the lighting device. By using the existing micro-control unit there is no need to provide an additional micro-control unit in the lighting device 200, and thus the number of components inside the lighting device 200 may be reduced. The control unit 130 is connected to the first control end B, and may reduce the voltage of the first control end B (for example, cause the first control end B grounded) by using a pin inside the control unit 130 (for example, the micro-control unit) when it is determined that the power supply input end is not connected to the dimmer or switch, so that the voltage of the first control end B may be pulled down to be lower than the first turn-on voltage.

In addition, when the control unit 130 determines whether the power supply input end is connected to the dimmer or switch by detecting the voltage characteristic of the first control end B, the control unit 130 may only be connected to the first control end B. When the control unit 130 determines whether the power supply input end is connected to the dimmer or switch by detecting the voltage of the second control end A or the third control end C, the control unit 130 may also be connected to the corresponding second control end A or the third control end C. Preferably, the control unit 130 determines whether the power supply input end is connected to the dimmer or switch by detecting the voltage characteristic of the first control end B, so as to realize a voltage control function of the first control end B and a voltage characteristic detection function by means of only one pin. When the control unit 130 determines whether the power supply input end is connected to the dimmer or switch by detecting the voltage characteristic of the second control end A or the third control end C, the control unit 130 needs two pins to realize the voltage control function of the first control end B and the voltage characteristic detection function, respectively.

Further, in combination with the voltage waveform described in FIGS. 2A and 2B, it is known that for the voltage $V_A$ (which is proportional to the input voltage $V_{AC}$) of the second control end A, within one cycle of $V_A$, the time period when the voltage is 0 in the case where the power supply input end is not connected to the dimmer or switch is much less than the time period when the voltage is 0 in the case where the power supply input end is connected to the dimmer or switch. Therefore, when the control unit 130 detects the voltage characteristic of the second control end A, the voltage characteristic is a time length when the voltage of the second control end A is lower than a predetermined threshold voltage within one cycle. When it is detected that the time length when the voltage of the second control end A is lower than the predetermined threshold voltage (the predetermined threshold voltage is a voltage close to 0) within one cycle is greater than a predetermined time period (e.g., 1 ms), the control unit 130 may determine that the power supply input end is connected to the dimmer or switch. Accordingly, when it is detected that the time length when the voltage of the second control end A is lower than the predetermined threshold voltage within one cycle is not greater than the predetermined time period, the control unit 130 may determine that the power supply input end is not connected to the dimmer or switch.

In addition, in combination with the voltage waveform described in FIGS. 2A and 2B, it is known that for the first control end B and the third control end C, when the power supply input end is not connected to the dimmer or switch, two closely adjacent voltage waveforms appear in the voltage waveforms; and when the power supply input end is connected to the dimmer or switch, any two adjacent voltage pulses in the voltage waveform are spaced apart by more than a predetermined time interval (for example, more than 1 ms). Therefore, when the control unit 130 detects the voltage characteristic of the first control end B or the third control end C, the voltage characteristic is an interval between adjacent voltage pulses of the corresponding first control end B or the third control end C. When it is detected that the interval between the adjacent voltage pulses of the first control end B or the third control end C is constantly greater than (e.g., greater than within two or more adjacent cycles) a predetermined time interval (e.g., 1 ms), the control unit 130 may determine that the power supply input end is connected to the dimmer or switch. Accordingly, when a case that the interval between the adjacent voltage pulses of the first control end B or the third control end C is not greater than the predetermined time interval is detected, the control unit 130 may determine that the power supply input end is not connected to the dimmer or switch.

Further, when the control unit 130 determines that the power supply input end is connected to the dimmer or switch, no operation is to be performed, that is, the voltage of the first control end B will not be adjusted. At this time, the first switch Q1 and the first resistor R1 may be periodically turned on to periodically charge the dimmer or switch 101.

Figure 3:
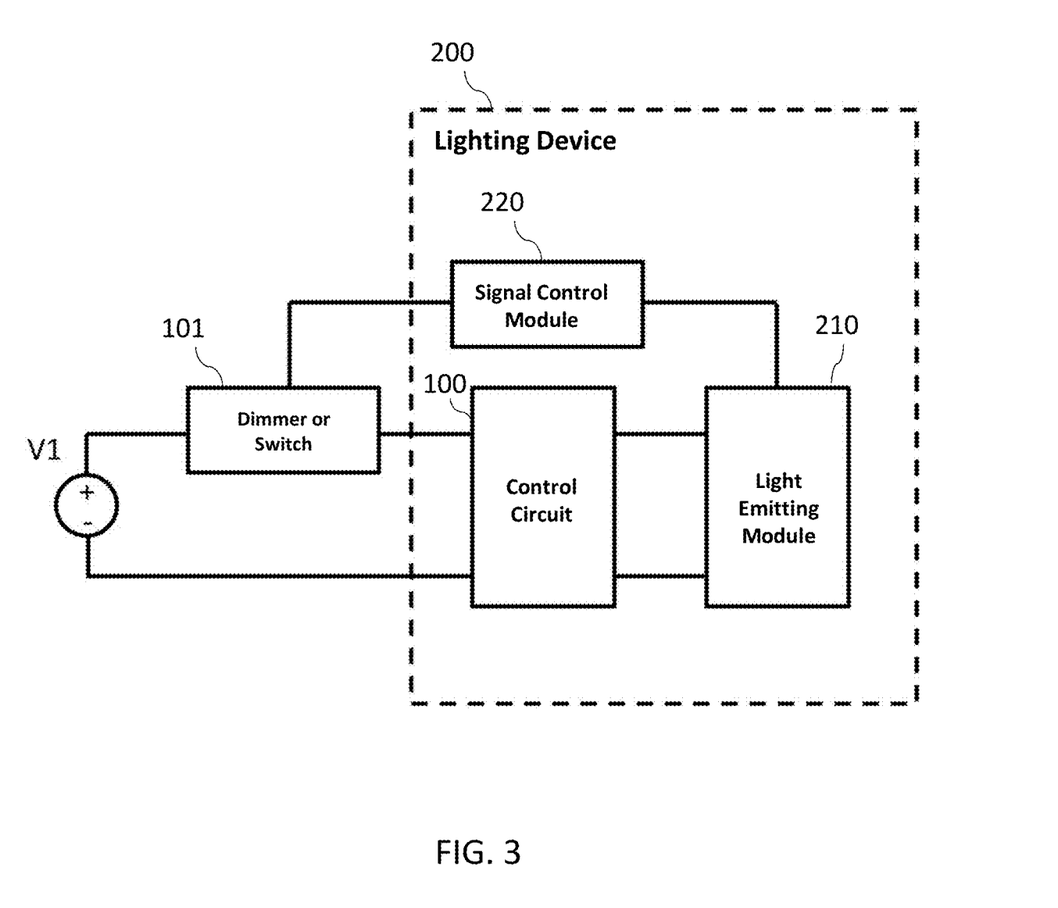
FIG. 3 shows a schematic structural diagram of a lighting device compatible with a dimmer or switch according to an embodiment of the present application.

The present application further provides a lighting device compatible with a dimmer or switch. FIG. 3 shows a schematic structural diagram of a lighting device compatible with a dimmer or switch according to an embodiment of the present application. As shown in FIG. 3, a lighting device 200 comprises: a light emitting module 210, connected to a power supply input end to emit light; and the above control circuit 100, wherein the control circuit 100 and the light emitting module 210 are connected in parallel to the power supply input end.

The lighting device 200 comprising the above control circuit 100 may realize the functions and effects of the control circuit 100 described with reference to FIGS. 1 and 2, and thus it will not be repeated here.

Further, the lighting device 200 may further comprise a signal control module 220, and the signal control module 220 is configured to: receive a voltage regulation signal from the dimmer or switch 101, when the dimmer or switch 101 is connected to the power supply input end AC of the light emitting module 210; convert the received voltage regulation signal into a driving signal of the light emitting module 210; and send the converted driving signal to the light emitting module 210, so that the light emitting module 210 emits light according to the driving signal, instead of emitting light according to the voltage regulation signal.

When the light emitting module 210 of the lighting device 200 is an intelligent light emitting module, if the light emitting module 210 is directly controlled by the voltage regulation signal from the dimmer or switch 101 to emit light, current overload of the intelligent light emitting module will be resulted in, thereby causing a failure of the light emitting module 210. Therefore, by providing the signal control module 220, the voltage regulation signal from the dimmer or switch 101 may be converted into a current driving signal for regulating the light emitting module 210, so that the failure of the intelligent light emitting module resulting from the direct control of the light emitting module 210 by the dimmer or switch 101 may be avoided, while realizing dimming. Moreover, the control of the lighting device 200 may still be achieved by means of the dimmer or switch 101.

In an exemplary embodiment of the present application, the converted driving signal may be sent to a control unit (e.g., an MCU) in the light emitting module 210, and the light emitting module 210 (or a control unit therein) may be configured to ignore the voltage regulation signal from the dimmer or switch 101, and only receive the driving signal to control the driving current of the LED.

The signal control module 220 may be integrated with the light emitting module 210 in a same housing, or may be arranged separately from the light emitting module 210. The signal control module 220 may be connected to the light emitting module 210 and the dimmer or switch 101 in a wired or wireless manner. For example, the signal control module 220 may be an application program that is installed in a mobile device (e.g., a mobile phone) far from the light emitting module, so as to receive the voltage regulation signal wirelessly (e.g., by means of WIFI, Bluetooth, and the like) from the dimmer or switch 101 and send the converted driving signal to the light emitting module 210 wirelessly.

Accordingly, the present application further proposes a control method compatible with a dimmer or switch. The dimmer or switch may be connected to a power supply input end of a light emitting module. The control method comprises: in response to that an input voltage of the power supply input end is between 0 and a first predetermined voltage, turning on a second switch Q2, so that a first switch Q1 of a charging assistance module is turned on; and in response to that the input voltage of the power supply input end is not between 0 and the first predetermined voltage, turning off the second switch Q2, so that the first switch Q1 of the charging assistance module is turned off, wherein the charging assistance module comprises a first switch Q1 and a first resistor R1, a resistance value of the first resistor R1 is lower than a predetermined resistance value, so that when the first switch Q1 is turned on, an overall resistance value of the first resistor R1 and the light emitting module 210 is lower than the predetermined resistance value, and the voltage of a first control end B of the first switch Q1 is controlled by a constant voltage source V0 and the second switch Q2, so that when the second switch Q2 is turned on, the first switch Q1 is turned on, and when the second switch Q2 is turned off, the first switch Q1 is turned off.

Further, the constant voltage source V0 is connected to the first control end B of the first switch Q1 via the second switch Q2, so that when the second switch Q2 is turned on, the first switch Q1 is turned on, and when the second switch Q2 is turned off, the first switch Q1 is turned off.

Further, the first switch Q1 is turned on when the voltage of the first control end B is higher than a first turn-on voltage, and the second switch Q2 is turned on when the voltage of a second control end A of the second switch Q2 is lower than a second turn-on voltage.

Therefore, turning on the second switch Q2 in response to that the input voltage of the power supply input end is between 0 and the first predetermined voltage comprises: in response to that the input voltage of the power supply input end is between 0 and the first predetermined voltage, the voltage of the second control end A of the second switch Q2 is made lower than the second turn-on voltage.

The second control end A is connected to the power supply input end via a voltage dividing resistor, so that when the input voltage of the power supply input end is lower than the first predetermined voltage, the voltage of the second control end A of the second switch Q2 may be lower than the second turn-on voltage.

In the present application, the control method compatible with the dimmer or switch corresponds to the aforementioned control circuit 100 compatible with the dimmer or switch, and both may achieve the same technical effects, so no repeated description will be given herein.

It should be noted that, the terms used here are only for describing specific embodiments, and are not intended to limit the exemplary embodiments according to the present application. As used herein, unless the context clearly indicates otherwise, the singular form is also intended to include the plural form, and in addition, it should also be understood that, when the terms "comprising" and/or "including" are used in this specification, they indicate the presence of features, steps, works, devices, components, and/or combinations thereof.

It should be illustrated that, the terms "first" and "second" and the like in the specification and claims of the present application and the above-mentioned drawings are used for distinguishing similar objects, and are not necessarily used for describing a specific sequence or precedence order. It should be understood that the data used in this way may be interchanged under appropriate circumstances, so that the embodiments of the present application described herein may be implemented in a sequence other than those illustrated or described herein.

The foregoing descriptions are only preferred embodiments of the present application, and are not intended to limit the present application, and for those skilled in the art, the present application may have various modifications and changes. Any modifications, equivalent replacements, improvements and the like, made within the spirit and principle of the present application, shall all be included in the protection scope of the present application.

The invention claimed is:

1. A control circuit compatible with a dimmer or switch, wherein the dimmer or switch is connectable to a power supply input end of a light emitting module, and the control circuit comprises:
a charging assistance module, used for assisting in the charging of the dimmer or switch, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value; and
a charging control module, comprising a constant voltage source and a second switch, wherein the charging control module is used for controlling a voltage of a first control end of the first switch, so that the first switch is turned on when an input voltage of the power supply input end is between 0 and a first predetermined voltage.

2. The control circuit according to claim 1, wherein the first switch is turned on when the voltage of the first control end is higher than a first turn-on voltage, and the second switch is turned on when the voltage of a second control end of the second switch is lower than a second turn-on voltage,
wherein when the input voltage of the power supply input end is between 0 and the first predetermined voltage, the voltage of the second control end of the second switch is lower than the second turn-on voltage.

3. The control circuit according to claim 2, wherein the constant voltage source is connected to the first control end of the first switch via the second switch, so that when the second switch is turned on, the voltage of the first control end is higher than the first turn-on voltage, and the first switch is turned on accordingly.

4. The control circuit according to claim 2, wherein the charging assistance module and the light emitting module are connected in parallel to the power supply input end, so that when the first switch is turned on, the overall resistance value of the first resistor and the light emitting module, which are connected in parallel, is lower than the predetermined resistance value.

5. The control circuit according to claim 2, wherein the second control end is connected to the power supply input end via a voltage dividing resistor, so that when the input voltage of the power supply input end is lower than the first predetermined voltage, the voltage of the second control end of the second switch is lower than the second turn-on voltage.

6. The control circuit according to claim 1, further comprising a control unit, wherein the control unit is configured to:
detect a voltage characteristic of the first control end, the second control end of the second switch, or a third control end located between the first switch and the first resistor;
determine, according to the detected voltage characteristic, whether the power supply input end is connected to the dimmer or switch;
when it is determined that the power supply input end is not connected to the dimmer or switch, pull down the voltage of the first control end to be lower than the first turn-on voltage of the first switch; and
when it is determined that the power supply input end is connected to the dimmer or switch, not adjust the voltage of the first control end.

7. The control circuit according to claim 6, wherein when detecting the voltage characteristic of the first control end, the voltage characteristic is an interval between adjacent voltage pulses of the first control end; when detecting the voltage characteristic of the second control end, the voltage characteristic is a time length when the voltage of the second control end is lower than a predetermined threshold voltage within one cycle; and when detecting the voltage characteristic of the third control end, the voltage characteristic is the interval between adjacent voltage pulses of the third control end.

8. The control circuit according to claim 7, wherein when it is detected that the interval between the adjacent voltage pulses of the first control end or the third control end is constantly greater than a predetermined time interval, the control unit determines that the power supply input end is connected to the dimmer or switch.

9. The control circuit according to claim 7, wherein when it is detected that the time length when the voltage of the second control end is lower than the predetermined threshold voltage within one cycle is longer than a predetermined time period, the control unit determines that the power supply input end is connected to the dimmer or switch.

10. A lighting device compatible with a dimmer or switch, wherein the lighting device comprises:
   a light emitting module, connected to a power supply input end to emit light; and
   a control circuit comprising:
   a charging assistance module, used for assisting in the charging of the dimmer or switch, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value, and
   a charging control module, comprising a constant voltage source and a second switch, wherein the charging control module is used for controlling a voltage of a first control end of the first switch, so that the first switch is turned on when an input voltage of the power supply input end is between 0 and a first predetermined voltage, wherein the control circuit and the light emitting module are connected in parallel to the power supply input end.

11. The lighting device compatible with the dimmer or switch according to claim 10, wherein the lighting device further comprises a signal control module, and the signal control module is configured to:
   receive a voltage regulation signal from the dimmer or switch, when the dimmer or switch is connected to the power supply input end of the light emitting module;
   convert the received voltage regulation signal into a driving signal of the light emitting module; and
   send the converted driving signal to the light emitting module, so that the light emitting module emits light according to the driving signal, instead of emitting light according to the voltage regulation signal.

12. The lighting device compatible with the dimmer or switch according to claim 11, wherein the signal control module is an application program that is installed in a mobile device far from the light emitting module.

13. A control method compatible with a dimmer or switch, wherein the dimmer or switch is connected to a power supply input end of a light emitting module, and the control method comprises:
   in response to that an input voltage of the power supply input end is between 0 and a first predetermined voltage, turning on a second switch, so that a first switch of a charging assistance module is turned on; and
   in response to that the input voltage of the power supply input end is not between 0 and the first predetermined voltage, turning off the second switch, so that the first switch of the charging assistance module is turned off, wherein the charging assistance module comprises a first switch and a first resistor, a resistance value of the first resistor is lower than a predetermined resistance value, so that when the first switch is turned on, an overall resistance value of the first resistor and the light emitting module is lower than the predetermined resistance value, and
   the voltage of a first control end of the first switch is controlled by a constant voltage source and the second switch, so that when the second switch is turned on, the first switch is turned on, and when the second switch is turned off, the first switch is turned off.

14. The control method according to claim 13, wherein the constant voltage source is connected to the first control end of the first switch via the second switch, so that when the second switch is turned on, the first switch is turned on, and when the second switch is turned off, the first switch is turned off.

15. The control method according to claim 13, wherein the first switch is turned on when the voltage of the first control end is higher than a first turn-on voltage, the second switch is turned on when the voltage of a second control end of the second switch is lower than a second turn-on voltage, and
   turning on the second switch in response to that the input voltage of the power supply input end is between 0 and the first predetermined voltage comprises: in response to that the input voltage of the power supply input end is between 0 and the first predetermined voltage, the voltage of the second control end of the second switch is made lower than the second turn-on voltage.

16. The control method according to claim 15, wherein the second control end is connected to the power supply input end via a voltage dividing resistor, so that when the input voltage of the power supply input end is lower than the first predetermined voltage, the voltage of the second control end of the second switch is lower than the second turn-on voltage.

17. The control method according to claim 13, further comprising:
   detecting a voltage characteristic of the first control end, the second control end of the second switch, or a third control end located between the first switch and the first resistor;
   determining, according to the detected voltage characteristic, whether the power supply input end is connected to the dimmer or switch;
   when it is determined that the power supply input end is not connected to the dimmer or switch, pulling down the voltage of the first control end to be lower than the first turn-on voltage of the first switch; and
   when it is determined that the power supply input end is connected to the dimmer or switch, not adjusting the voltage of the first control end.

18. The control method according to claim 17, wherein when detecting the voltage characteristic of the first control end or the third control end, the voltage characteristic is an interval between adjacent voltage pulses of the corresponding control end, and determining, according to the detected voltage characteristic, whether the power supply input end is connected to the dimmer or switch comprises:
   when it is detected that the interval between the adjacent voltage pulses of the corresponding control end is constantly greater than a predetermined time interval, determining that the power supply input end is connected to the dimmer or switch, and when a case that the interval between the adjacent voltage pulses of the corresponding control end is not greater than the predetermined time interval is detected, determining that the power supply input end is not connected to the dimmer or switch.

19. The control method according to claim 17, wherein when detecting the voltage characteristic of the second control end, the voltage characteristic is a time length when the voltage of the second control end is lower than a predetermined threshold voltage within one cycle, and determining, according to the detected voltage characteristic, whether the power supply input end is connected to the dimmer or switch comprises:

when it is detected that the time length when the voltage of the second control end is lower than the predetermined threshold voltage within one cycle is greater than a predetermined time period, determining that the power supply input end is connected to the dimmer or switch, and when it is detected that the time length when the voltage of the second control end is lower than the predetermined threshold voltage within one cycle is not greater than the predetermined time period, determining that the power supply input end is not connected to the dimmer or switch.

20. The control method according to claim 13, further comprising:

receiving a voltage regulation signal from the dimmer or switch, when the dimmer or switch is connected to the power supply input end of the light emitting module;

converting the received voltage regulation signal into a driving signal of the light emitting module; and sending the converted driving signal to the light emitting module, so that the light emitting module emits light according to the driving signal, instead of emitting light according to the voltage regulation signal.

* * * * *